United States Patent
Jackson et al.

(10) Patent No.: US 7,613,858 B1
(45) Date of Patent: Nov. 3, 2009

(54) IMPLEMENTING SIGNAL PROCESSING CORES AS APPLICATION SPECIFIC PROCESSORS

(75) Inventors: Robert Jackson, Oxford (GB); Sambuddhi Hettiaratchi, High Wycombe (GB)

(73) Assignee: Altera Corporation, San Jose, CA (US)

( * ) Notice: Subject to any disclaimer, the term of this patent is extended or adjusted under 35 U.S.C. 154(b) by 550 days.

(21) Appl. No.: 11/042,887

(22) Filed: Jan. 24, 2005

(51) Int. Cl.
*G06F 13/00* (2006.01)
(52) U.S. Cl. .......................... 710/104; 716/16; 712/33
(58) Field of Classification Search ................ 710/104, 710/300; 713/100; 703/13–15; 716/1–5, 716/16–18; 717/100; 715/700, 762, 763; 708/404; 712/32–37, 41
See application file for complete search history.

(56) References Cited

U.S. PATENT DOCUMENTS

| | | | | |
|---|---|---|---|---|
| 5,751,592 | A * | 5/1998 | Takai et al. ................... | 716/5 |
| 6,408,428 | B1 * | 6/2002 | Schlansker et al. ............ | 716/17 |
| 6,425,116 | B1 * | 7/2002 | Duboc et al. ................... | 716/18 |
| 6,581,187 | B2 * | 6/2003 | Gupta et al. .................... | 716/1 |
| 6,651,222 | B2 * | 11/2003 | Gupta et al. .................... | 716/1 |
| 6,708,144 | B1 * | 3/2004 | Merryman et al. ............ | 703/14 |
| 6,728,939 | B2 * | 4/2004 | Johannsen ..................... | 716/5 |
| 6,829,754 | B1 | 12/2004 | Yu et al. | |
| 6,907,592 | B1 | 6/2005 | Dante | |
| 6,971,066 | B2 * | 11/2005 | Schultz et al. ............... | 715/771 |
| 7,117,015 | B2 * | 10/2006 | Scheinert et al. ............ | 455/561 |
| 7,290,244 | B2 * | 10/2007 | Peck et al. .................... | 717/109 |
| 7,409,533 | B2 * | 8/2008 | Jones .......................... | 712/201 |
| 2002/0055947 | A1 * | 5/2002 | Schultz et al. .............. | 707/500 |
| 2002/0194236 | A1 * | 12/2002 | Morris ........................ | 708/403 |
| 2004/0204097 | A1 * | 10/2004 | Scheinert et al. ............ | 455/561 |
| 2005/0068943 | A1 * | 3/2005 | Scheinert ..................... | 370/352 |
| 2007/0054668 | A1 * | 3/2007 | Scheinert et al. ......... | 455/435.1 |

OTHER PUBLICATIONS

"A DSP-controlled PWM generator using field programmable gate array" by Arbit et al. (abstract only) Publication Date: Sep. 6-7, 2004.*
"Macrocell/microcell selection schemes based on a new velocity estimation in multitier cellular system" by Chung et al. (abstract only), Publication Date: Sep. 2002.*
Warren Webb, "EPIC Computer Features GPS, data Acquisition, and Expansion", www.edn.com, Jul. 22, 2004, pp. 11-16.
Kevin Morris "FPGA and Programmable Logic, Catapult C", FPGA and Programmable Logic Journal, Jun. 1, 2004.
Gabe Moretti, Mentor Graphics Corp., "C Tool Provides Algorithmic Synthesis" EDN Jun. 1, 2004.
Jackson et al, "Methods And Apparatus For Implementing Application Specific Processors", U.S. Appl. No. 11/040,152, filed Jan. 20, 2005.
Final Office Action Mailed Aug. 13, 2007, U.S. Appl. No. 11/040,152.

* cited by examiner

*Primary Examiner*—Clifford H Knoll
(74) *Attorney, Agent, or Firm*—Weaver Austin Villeneuve & Sampson LLP

(57) ABSTRACT

Methods and apparatus are provided for efficiently implementing signal processing cores as application specific processors. A signal processing core, such as a Fast Fourier Transform (FFT) core or a Finite Impulse Response (FIR) core includes a data path and a control path. A control path is implemented using processor components to increase resource efficiency. Both the data path and the control path can be implemented using function units that are selected, parameterized, and interconnected. A variety of signal processing algorithms can be implemented on the same application specific processor.

23 Claims, 13 Drawing Sheets

IMPLEMENTING SIGNAL PROCESSING CORES AS APPLICATION SPECIFIC PROCESSORS

CROSS-REFERENCE TO RELATED APPLICATIONS

The present application is related the U.S. patent application Ser. No. 11/040,152 titled Application Specific Processors by Robert Jackson et al., filed on Jan. 20, 2005, the entirety of which is incorporated by reference in its entirety.

BACKGROUND OF THE INVENTION

1. Field of the Invention

The present invention relates to application specific processors. In one example, the present invention relates to implementing signal processing cores as application specific processors.

2. Description of the Prior Art

A number of benefits have spurred efforts towards developing more easily customizable signal processing devices. Designers often have difficulty implementing devices with resource, speed, and cost characteristics that match needs and requirements. On one end of the spectrum, a designer can implement an application specific integrated circuit (ASIC) or a Digital Signal Processor (DSP) that has substantial processing efficiency and small marginal costs on a per unit basis. However, drawbacks include substantial design costs as well as significant risks that a redesign may be needed. A designer can also select an application specific standard product (ASSP) that provides the processing power of an ASIC or DSP but is available as an off-the-shelf component. However ASSPs are typically only available for relatively generic purposes. Some ASICs and ASSPs include some programmability, however the programmability may not be sufficient for customizing the device for a particular use.

Programmable chips can also be selected. Programmable chips can be relatively easily customized for particular uses, however the marginal costs on a per unit basis may be more significant and some processing power may be sacrificed. Furthermore, implementing programmable devices is often not straightforward. In many instances, a non-optimal design is often selected because of ease of implementation. The non-optimal design may require more logic resources than necessary and therefore require a more expensive programmable chip. Tools used to simplify implementation, such as tools that convert high level language code to hardware description language files, also often do not take advantage of the specific hardware architectures.

Designers can also select devices with both hard coded logic and programmable logic, but the hard coded logic may be inefficiently used.

Mechanisms for implementing signal processing devices in a cost effective and resource efficient manner are limited. Consequently, there are continued efforts to provide devices that overcome at least some of the drawbacks noted above.

SUMMARY OF THE INVENTION

Methods and apparatus are provided for efficiently implementing signal processing cores as application specific processors. A signal processing core, such as a Fast Fourier Transform (FFT) core or a Finite Impulse Response (FIR) core includes a data path and a control path. A control path is implemented using processor components to increase resource efficiency. Both the data path and the control path can be implemented using function units that are selected, parameterized, and interconnected. A variety of signal processing algorithms can be implemented on the same application specific processor.

In one embodiment, a method for implementing a custom processor is provided. Multiple function units corresponding to components for implementing a signal processing core as an application specific processor are received. Ones of the plurality of function units are selected and parameterized by a user. Interconnection information for connecting the plurality of function units is received. A hardware description is generated for instantiating the plurality of function units and connecting the plurality of function units.

In another embodiment, an apparatus for implementing an application specific processor is provided. The apparatus include an interface and a processor. The interface is configured to receive multiple function units corresponding to components for implementing a signal processing core as an application specific processor. The interface is also configured to receive interconnection information for connecting the plurality of function units. The processor is configured to generate a hardware description for instantiating the plurality of function units and connecting the plurality of function units.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1A:
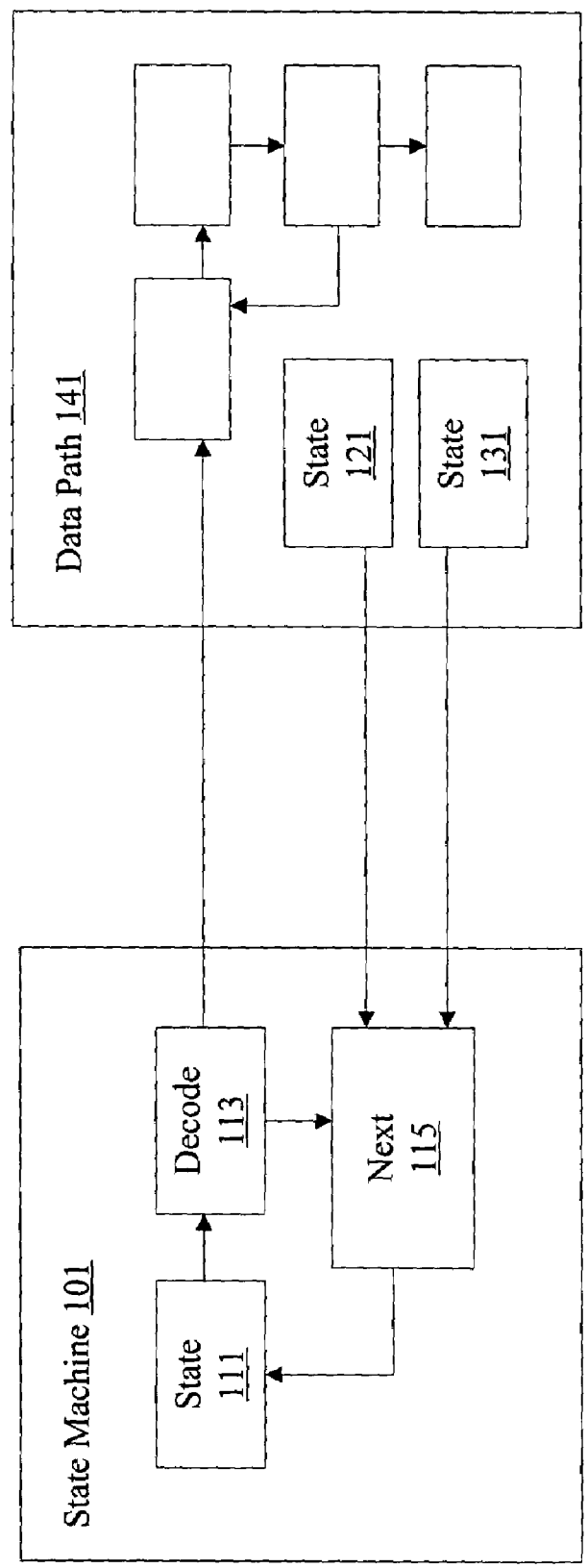
FIG. 1A is a diagrammatic representation showing a finite state machine and a data path.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of particular processors and devices. However, it should be noted that the techniques of the present invention can be applied to a variety of types of processors and devices and associated software. In the following description, numerous specific details are set forth in order to provide a thorough understanding of the present invention. The present invention may be practiced without some or all of these specific details. In other instances, well known process operations have not been described in detail in order not to unnecessarily obscure the present invention. Techniques and mechanisms are also often associated with certain processes and components that are optional, unless noted otherwise. Optional processes and components may sometimes be removed or introduced into particular process flows or devices without affecting the operation of the present invention.

Furthermore, techniques and mechanisms of the present invention will sometimes be described in singular form for clarity. However, it should be noted that some embodiments can include multiple iterations of a technique or multiple instantiations of a mechanism unless noted otherwise. For example, a processor is used in a variety of contexts. However, it will be appreciated that multiple processors can also be used while remaining within the scope of the present invention.

Implementing a signal processing device using a hardware description language such as VHDL or Verilog is a time-consuming and arduous process. Although hardware description languages allow a designer to describe an optimal implementation for a device, that implementation may not be produced even by a skilled designer. Often, a suboptimal implementation is chosen because it is easier to describe or correctly implement. Consequently, a variety of tools and programs have been developed to improve the hardware design process.

Some tools allow programs written in high-level languages such as C and C++ to be compiled into HDL and implemented on a device. Any programming language allowing functional description of processes that does not require knowledge of the underlying hardware is referred to herein as a high-level language. However, these tools are often inefficient because they cannot define specialized functional blocks for particular devices or topologies. That is, the hardware description generated is often highly generic and may not be well suited for a particular device. In many instances, these tools can only use simple arithmetic logic units (ALUs), load/store blocks, and register files found in conventional devices. Furthermore, the process of automatically translating a generic description into a hardware configuration is often difficult.

Some other tools implement devices using components that are infrequently used. For example, the device may be used to implement an algorithm such as a Fast Fourier Transform (FFT). A Fast Fourier Transform can be conceptually divided into data path functionality and control path functionality. In many instances, the control path functionality is infrequently used as state changes only occur periodically. Nonetheless, control path functionality and data path functionality are often implemented using dedicated circuitry. Control functionality may be implemented using counters and indices that compute values such as mean and max data values. The control path and the data path are often closely coupled and sometimes difficult to separate. The control path is implemented to maximize efficiency and to allow the generation of state information as soon as possible. Resources are devoted to implementing control path functionality even though the bulk of the processing occurs in the data path. Tools often implement hardware devices inefficiently.

Consequently, the techniques and mechanisms of the present invention provide tools to allow a designer to implement an efficient custom processor such as a signal processing device. Any device having a signal processing core is referred to herein as a signal processing device. In some examples, a signal processing core is an Fast Fourier Transform, (FFT), Finite Impulse Response (FIR), delayed Least Mean Squares (LMS) FIR, symmetrical real FIR, Infinite Impulse Response (IIR), or decimation-in-time FFT core. A signal processing device can also perform functions such as polynomial evaluation, maximum value search, matrix multiply, and matrix transpose operations.

Various function units such as registers, memory, counters, multiply accumulate blocks, input channels, output channels, shifters, etc. can be selected and parameterized from a library. The designer can then identify how the function units are interconnected. Components for implementing a custom signal processor are referred to herein as function units. For example, using the techniques of the present invention, the output of a multiply accumulate block can be coupled to the input of a barrel shifter. The data path can be coded as a set of function units. According to various embodiments, the control path is coded as a program using a single arithmetic logic unit (ALU) to carry out state computations. The infrequently accessed state information is collected in memory. By using a single ALU and a memory to carry out all state computations, hardware resources can be conserved. Although implementing the control path as a program using an ALU and memory can mean that some state transitions that used to be calculated in a single cycle now take multiple cycles, the techniques of the present invention recognize that this trade-off is beneficial because of the amount of hardware resources conserved and the minimal impact on algorithm execution.

A tool can be used to automatically identify or generate function units to use as building blocks for a device having a controller implemented as a processor. Information identifying connections between function units can be received from a user and missing or incorrect interconnections can be rerouted or created. The techniques and mechanisms of the present invention allow a high-level description of the device to be implemented in a targeted and resource efficient manner.

FIG. 1A is a diagrammatic representation showing a device implemented with a data path and a state machine. It should be noted that the data path 141 and the state machine 101 are often closely coupled and may be conceptually separated in a variety of manners. In many implementations, a device implemented as a data path 141 and a state machine 101 gives high-performance by optimizing data path components. The state machine provides the current state 111 that is passed through a decoder 113 to control the operation of the data path. The data path includes a number of blocks linked together in an application specific topology. The data path also includes a number of pieces of state information including state 121 and state 131. The state information can include counters, indexes, and compute values. For example, the counter may be incremented for each piece of data that is processed. The state machine 101 is also optimized.

In many implementations, both the state machine 101 and data path 141 can be implemented using native HDL. The HDL implemented state machine 101 is able to execute a very large number of state transitions in a small amount of time. In fact, the state machine 101 is often able to compute state transitions far more frequently than the data path 141 needs for operation. In some examples, well over 90 percent of the activity occurs in the data path while the state machine 101 is often left idle, since a next state transition 115 is calculated infrequently. Functional units used to calculate state transitions include comparators, arithmetic operators, and other selection operators and may also include memory implemented as registers storing pieces of data. Few if any of the components used to compute the next state are reused. In some examples, during 90 percent of the execution time, only a small subset of the state machine or controller circuitry is used.

This creates a great deal of inefficiency as the state machine components 101 are optimized to run as efficiently as the data path 141. The techniques of the present invention recognize that control circuitry as a finite state machine can be implemented in a slightly less efficient manner while allowing the conservation of a large amount of resources.

Figure 1B:
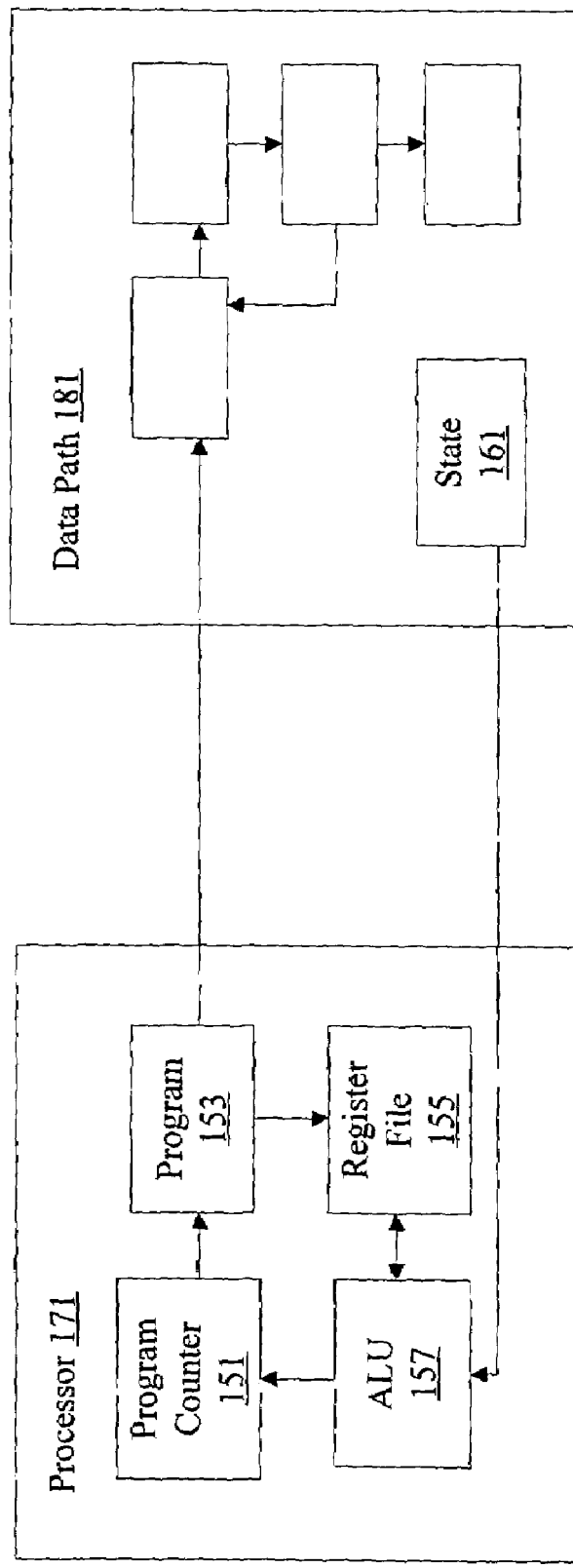
FIG. 1B is a diagrammatic representation showing a processor implemented controller.

FIG. 1B is a diagrammatic representation of an implementation according to various embodiments of the present invention. The data path 181 can remain optimized. However, according to various embodiments, a state machine is implemented as a processor 171. In many examples, infrequently changing state information is collected in a memory 155. Collecting state information in memory is particularly efficient on memory rich programmable chips. An arithmetic logic unit 157 is used to carry out state computations. The arithmetic logic unit is a relatively generic device that can be used to carry out the computations that specialized circuitry within a finite state machine typically performs. The arithmetic logic unit can perform comparisons, arithmetic operations, or cause jump or branch operations in a program. The processor 171 also includes a program counter 151 and a program 153.

With almost all the state information in memory, access to memory is typically performed sequentially with only one variable read or update per clock cycle. Access matches an arithmetic logic unit that performs a single computation per clock cycle. Using memory to hold state information means that some state transitions that used to be performed in a single cycle now take multiple cycles. However, given that the device with a processor 171 typically spends 90 percent of its time in a single state and the remaining time is spent in non performance critical tasks such as state transitions, performance is typically not significantly affected. In many implementations, controller logic implemented as a processor 171 uses fewer logic resources than a controller implemented as a finite state machine.

According to various embodiments, a controller implemented as a processor is computationally complete and can compute any function subject to memory constraints.

Figure 2:
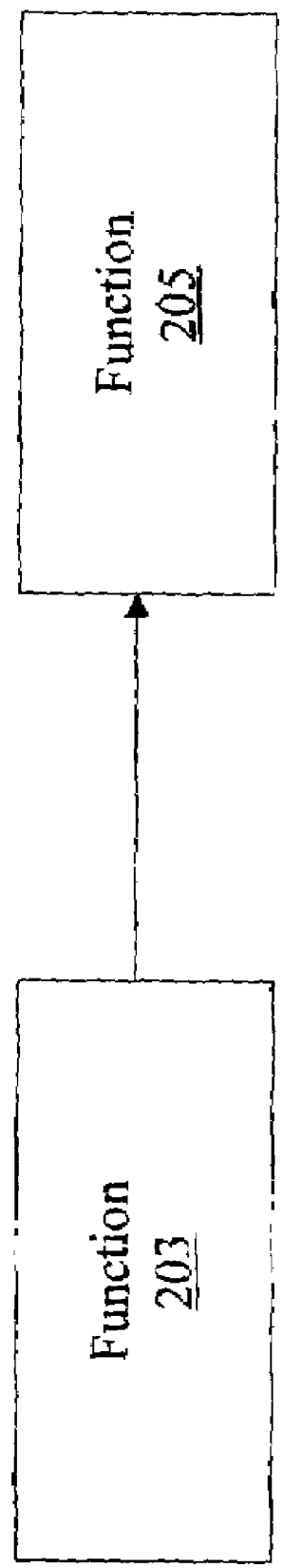
FIG. 2 is a diagrammatic representation showing control circuitry reuse for multiple functions.

FIG. 2 is a diagrammatic representation showing implementation of a more complex function. In conventional implementations, multiple functions 203 and 205 implemented on a device would require a finite state machine controller with more registers, more logic for comparators and arithmetic operations, and more multiplexers than a finite state machine controller with a single function 203. Footprint for control logic on a device would grow substantially. The processor as a controller implementation on the other hand only includes changes to the program to describe the new computations. If there is space in the program memory, no changes to hardware may be required.

If extra program memory is needed, memory can be increased by a factor of two or four with only minimal impact on the size of the controller. Since controller logic is typically infrequently used, negligible impact on system performance results. In one example, when two functions are applied in series, a single piece of hardware can be implemented to perform both functions. Implementing the functions using a processor as a controller makes composing the two functions on a single device relatively straightforward.

By using a program as a controller, changes to the algorithm can be implemented by simply reprogramming the controller without affecting the data path. Any programmable control path coupled to a data path that includes a program for controlling data path operation is referred to herein as a controller implemented as a processor. A controller implemented as a processor typically includes memory, an arithmetic logic unit, a program counter, and a program. It should be noted that a controller implemented as a processor may often be closely coupled to a data path.

According to various embodiments, the data path and the control path associated with a device can be implemented using a set of parameterizable function units. Function units may be available in a library and preoptimized to allow interconnection by a user. Function units can include processing function units, storage function units, infrastructure function units, and input output function units. In some examples, processing function units include arithmetic units, shifters, modulo counters, multiply accumulate blocks, complex multipliers, single integer multipliers, value combiners, and part selectors. Storage function units include registers and memory. Infrastructure function units include constant values, immediate fields, program counters, exit blocks, and uncommitted function units that can have ports and function specified by a user. In one example, uncommitted function units can have ports and functions specified by a user supplied Extensible Markup Language (XML) file. Input output function units can include general purpose output, general purpose input, bus masters, input channels, and output channels. Other types of function units including interface function units are possible as well.

Figure 3:
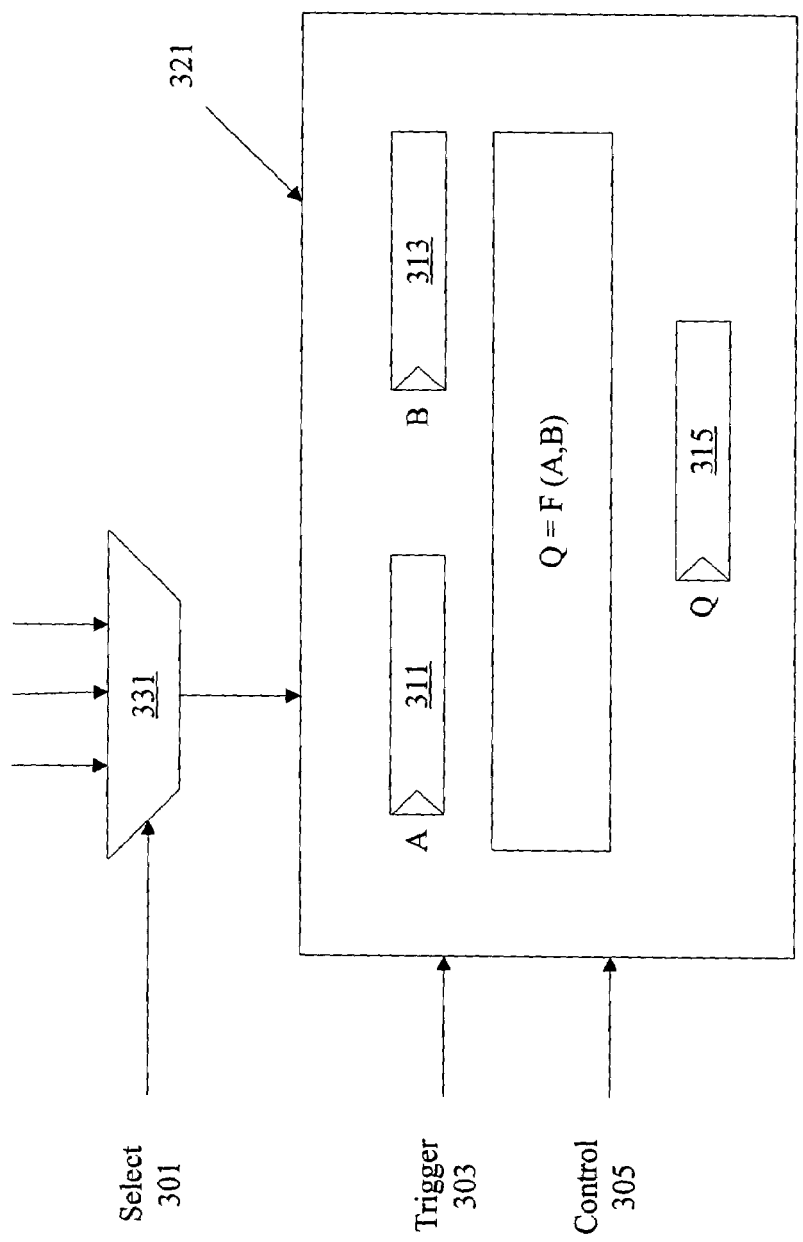
FIG. 3 is a diagrammatic representation showing a function unit.

FIG. 3 is a diagrammatic representation showing a function unit. According to various embodiments, the processor and data path are implemented using transport triggered function units. The transport triggered architecture uses a minimal amount of hardware to implement a processor like structure. According to various embodiments, most of the complexity associated with a processor architecture is moved into the program. The transport triggered architecture is hardware minimal so that is possible to use the parameterizable and optimized function units to construct the control path as well as the data path. According to various embodiments, the transport triggered function unit includes inputs 311 and 313 and output 315. A multiplexer 331 is used to select an input using select signal 301.

In many examples, the function units operate on the transport triggered basis. Data inputs and/or outputs are registered. Associated with some of the ports are enables or triggers which indicate that a new input value is being fed to the unit or read from it. The act of transporting data to or from the function unit triggers operation. The triggers 303 are typically derived from the program, although triggers can also be generated by other blocks. Some function units have an additional control port 305 that can provide additional control information. The value can be applied to the port at the same time the function unit is triggered. For example, an add/subtract unit may be triggered by moving data to its input 311. Applying a control signal at the same time will cause it to subtract rather than add.

Using a triggered architecture simplifies creation of a programmable pipeline. An alternative design uses a clock triggered architecture which performs an operation on each clock cycle. However, clocking makes implementing operations harder as input and output scheduling would become more complicated.

Figure 4:
FIG. 4 is a diagrammatic representation depicting a custom processor.

FIG. 4 is a diagrammatic representation of the structure of a device having a program, a program counter, a controller, and the data path. Although the components of a device can be conceptually separated, the boundary separating the data path 401, controller 403, program counter 405, and program 407 are rather flexible. The program 407 provides multiplexer select and trigger controls to the program counter 405, controller 403, and data path 401.

Figure 5:
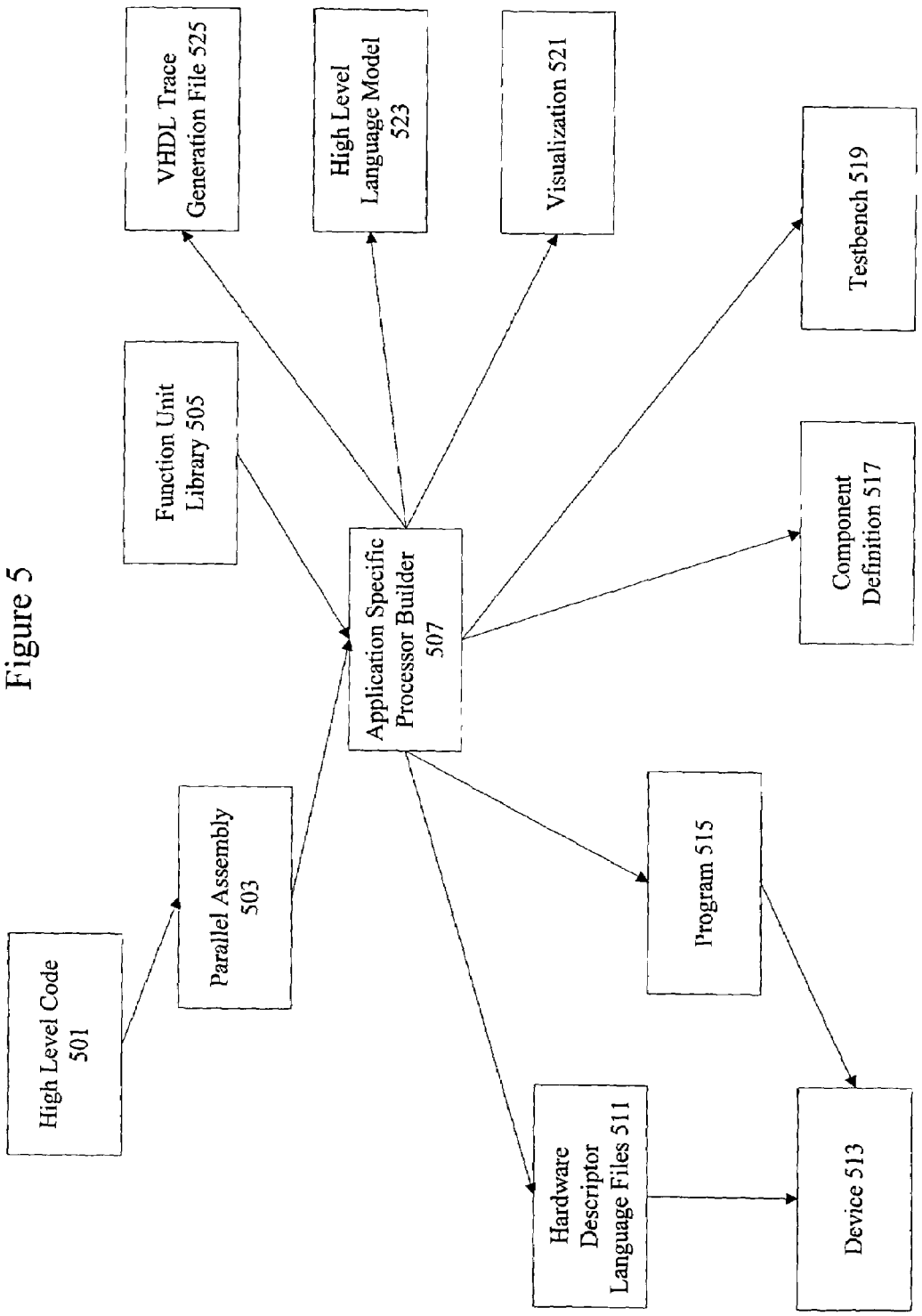
FIG. 5 is a diagrammatic representation showing a tool flow for implementation of a custom processor on a programmable device.

FIG. 5 is a diagrammatic representation of one example of a tool flow that is associated with implementation of a device. According to various embodiments, the device includes a data path and a processor implemented control path. Any device that includes a data path and a processor implemented control path is referred to herein as an application specific processor. According to various embodiments, the application specific processor includes a data path and a control path having an ALU, program counter, and a program. The tool used to implement an application specific processor is referred to as an application specific processor builder.

According to various embodiments, the application specific processor builder 507 receives function units from functional unit library 505 and high-level code 501 converted to parallel assembly 503. Function units and associated interconnections between function units can be specified within program files or databases or other user interfaces. For example, to declare a function unit, the following format can be used:

fu NAME = TYPE (PARAMETERS)
fu program_counter = basicpc (PC_WIDTH=>8, DELAY_ SLOTS=>2)
fu gpio0 = gpio (WIDTH=>16)

Values such as immediates and literals can be supplied as follows:

field NAME = TYPE (PARAMETERS)
field immPC = integer (WIDTH=>8)

Interconnections can be specified as follows:

mux NAME = TYPE
transport = (destinationA.port1, destinationB.port2}
<= {sourceX.port8, sourceY.port9, sourceZ.port0}

Some additional information can be given to the application specific processor builder about how to generate the processor as follows:

machine NAME = TYPE
machine = bound
machine fft_processor = unbound_transport_n1mux The program can be specified as move operations. For example, parallel move operations can be performed in parallel:

mov unitA.port1, unitX.port
|| mov unitB.port, unity.port4
||mov unitC.port5, unity.port4

A jump or branch instruction can be implemented by moving a new value to the program counter as follows:

mov programCounter.nextInstruction, immediate.START_OF_LOOP

Immediate values can be specified using a set or control command as follows:

set immediate__5.value, 0xFFFE
|| mov output0.d, immediate__5.value
|| mov output1.d, immediate__5.value
ctrl fp_alu.rounding mode, 4

After receiving function unit information and program information, the application specific processor builder 507 can provide a variety of outputs. According to various embodiments, the application specific processor builder 507 generates a processor using a hardware description language file 511. The description instantiates function units and interconnects the function units. The builder extracts hardware description language implementations of each function unit type used in the processor from a function unit library 505. Module generators may also be run at this stage to generate implementations. A program is also encoded to provide program file 515. According to various embodiments, the builder constructs an instruction word for the processor that includes any immediate fields used, multiplexer select lines, function unit triggers, and other control signals. The program is analyzed and encoded using the instruction word. The program can also be compressed to reduce the size of memory required to store the program.

However, by compressing the program, a decoder would have to be provided. Having a decoder may restrict the ways in which a processor can be used. Using the hardware descriptor language file 511 and the program file 515, a device 513 can be implemented. The builder 507 can also generate a test bench 519 to allow for automated testing of the device. A visualization 521 can be generated to provide a graphical representation of function units in the connections between them. In some examples, a high-level language model 523 is generated to allow modeling of the program. A VHDL trace generation file 525 is provided to allow the creation of a trace file when the program is executed by the processor running in the hardware description language simulator. A component definition 517 can also be used to describe the device as a component for use on a system on a programmable chip. This allows the application specific processor to be implemented as a stand-alone device or as a component within a larger device.

Figure 6:
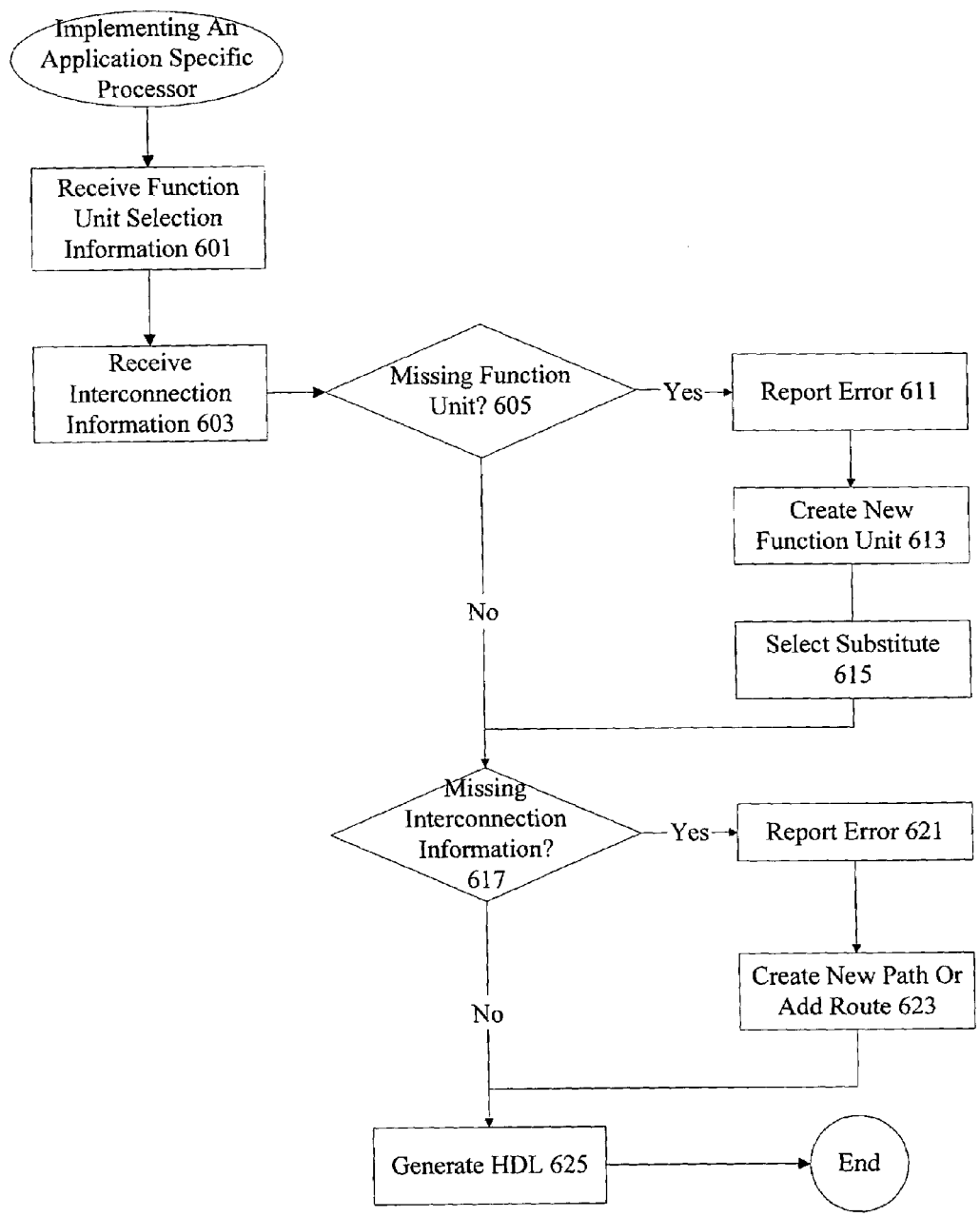
FIG. 6 is a process flow diagram showing one technique for implementing a custom processor.

FIG. 6 is a flow process diagram showing a technique for implementing a device. At 601, function unit selection information is received. Function unit selection information is typically provided by a user with access to a library of function units. The function units can be widely used, parameterizable components that are preoptimized by designers. At 603, interconnection information is received. Interconnection information identifies how the various function units are interconnected. At 605, it is determined if there is a missing function unit.

For example, based on the interconnection information, it may be inferred that a function unit required has not yet been declared. If the function unit is missing at 605, an error can be reported at 611. In some examples, no error reporting is needed. According to various embodiments, a new function unit is created at 613. A substitute for the missing function unit can then be selected at 615. In one example, the new function unit is created and selected automatically after a user is prompted for function unit information.

It should be noted that in some examples, a new function unit is not needed and a substitute can be selected from a function unit library. In one example, a substitute may be selected from a slightly modified function unit in a function unit library. At 617, is determined if interconnection information is missing. For example, if inputs or outputs are left unconnected, missing interconnections can be inferred. An error can be reported at 621 or a new path or added route can be created at 623. At 625, the hardware description language file is generated.

Figure 7:
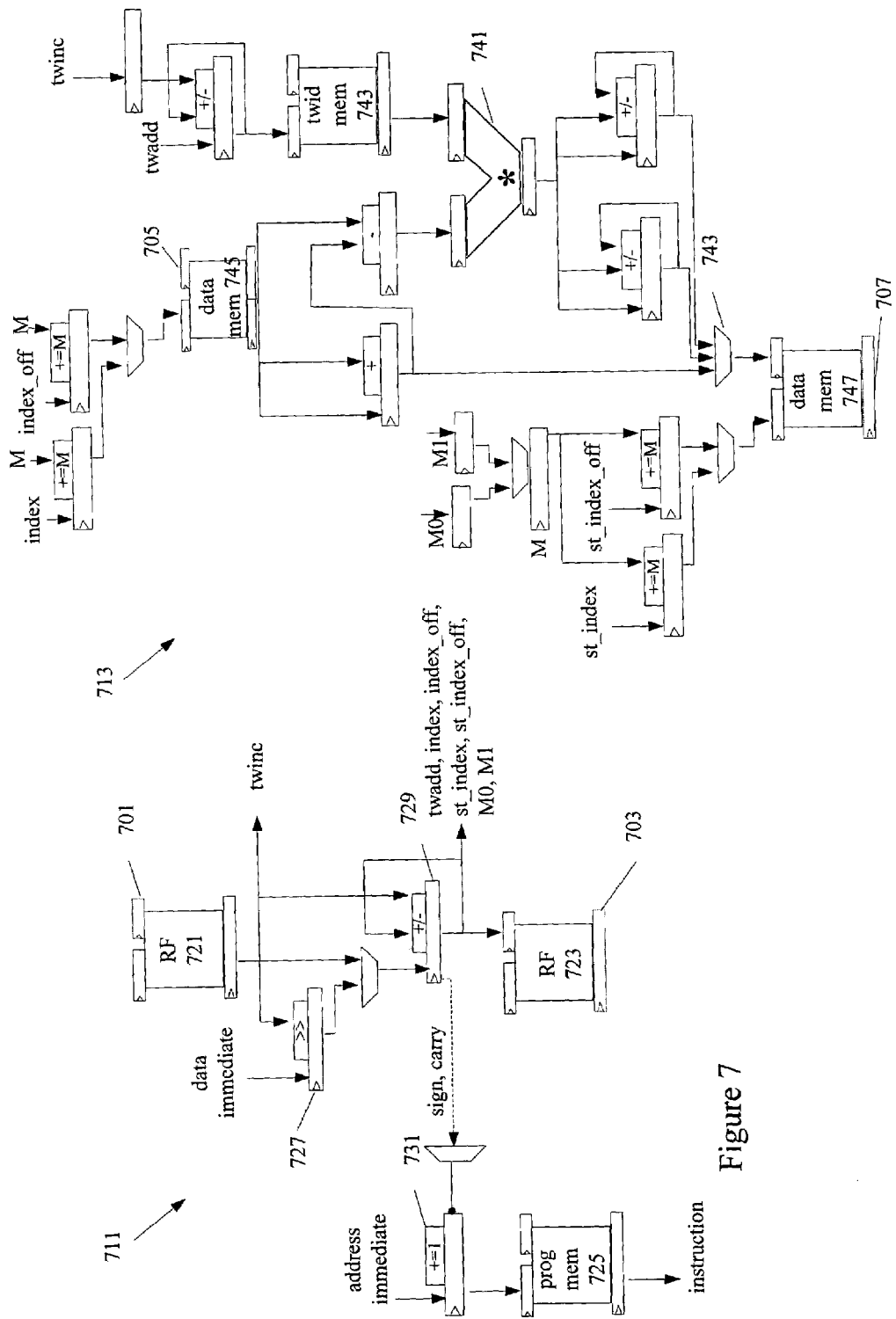
FIG. 7 is a diagrammatic representation showing one example of a radix-2 FFT architecture.

Although an application specific processor can be used to perform a variety of functions, the techniques of the present invention recognize that an application specific processor can be particularly effective in implementing a signal processor. FIG. 7 is a diagrammatic representation showing one example of a radix-2 FFT architecture implemented as an application specific processor. The architecture uses a single multiplier and implements a 1024 point FFT. The control lines that connect clock enables and mux-select inputs to the instruction word have been omitted in FIG. 7 for clarity.

The architecture includes a control path 711 and a data path 713. The control path 711 includes register files 721 and 723, program memory 725, loadable shifter 727, loadable adder/subractor 729, and loadable counter 731. The data path 713 includes separate paths for real and imaginary portions of complex numbers. The data path 713 includes multiple loadable adders and subtractors, multiple loadable counters, memory 743, 745, and 747, a single multiplier 741, and a registered 3:1 multiplexer 743. According to various embodiments, the 3:1 multiplexer is implemented using a 2:1 multiplexer and a control line. The ports 701, 703, 705, and 707 are available for data input and output.

According to various embodiments, the following simplified Matlab code represents the core of the radix-2 FFT algorithm. By implementing the non-datapath functionality such as managing the loop iterations and loading addresses using the processor, this implementation is able to reduce the number of logic elements used.

groups=1;

bflys=point/2;

twinc=1;

for pp=1 passes;
  for gg=1:groups;
  twadd=1;
  for bb=1:bflys;
    index=(gg−1)*2*bflys+bb;
    tempreal=datareal(index)−datareal(index+bflys);
    tempimag=dataimag(index)−dataimag(index+bflys);
    datareal(index)=datareal(index)+datareal(index+bflys);
    dataimag(index)=dataimag(index)+dataimag(index+bflys);
    datareal(index+bflys)=tempreal*twreal(twadd)−tempimag*twimag(twadd);
    dataimag(index+bflys)=tempreal*twimag(twadd)−tempimag*twreal(twadd);
  end;
  end;
  groups=groups*2;

bflys=bflys/2;
twinc=twinc*2;
end;

According to various embodiments, the architecture shown in FIG. 7 implements a 1024 point FFT in 95 us using 322 logic elements at 221 MHz.

Figure 8:
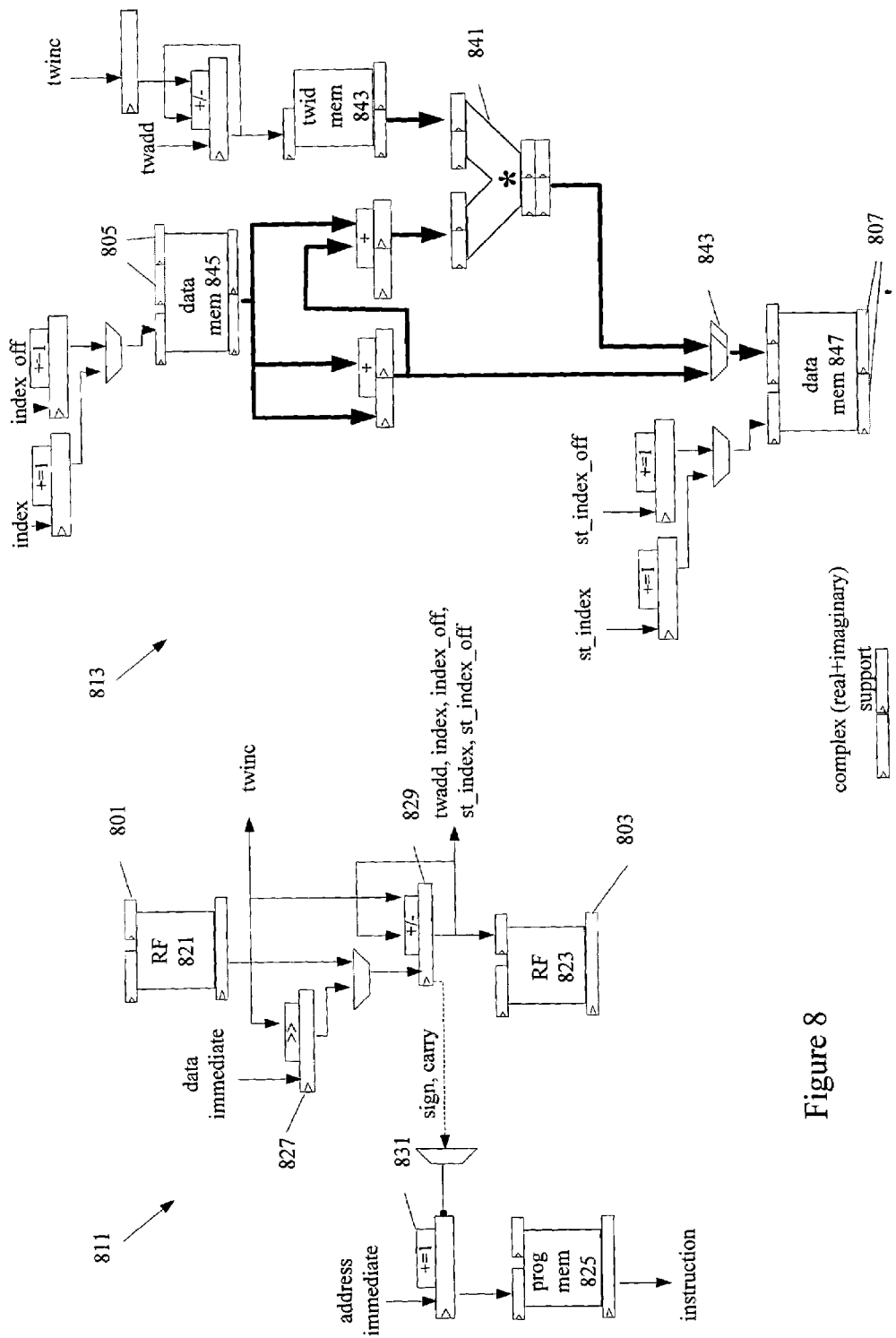
FIG. 8 is a diagrammatic representation showing one example of a complex radix-2 FFT architecture having a data path supporting real and imaginary components.

FIG. 8 is a diagrammatic representation showing one example of a radix-2 FFT architecture implemented using a wider datapath supporting complex numbers. The architecture includes a control path 811 and a data path 813. The control path 811 includes register files 821 and 823, program memory 825, loadable shifter 828, loadable adder/subtractor 829, and loadable counter 831. The data path 813 provides complex number support. The data path 813 includes multiple loadable adders and subtractors, multiple loadable counters, memory 843, 845, and 848, a single multiplier 841, and a registered 3:1 multiplexer 843. According to various embodiments, the 3:1 multiplexer is implemented using a 2:1 multiplexer and a control line. The ports 801, 803, 805, and 808 are available for data input and output.

According to various embodiments, the architecture shown implements a 1024 point FFT in 47 us using 302 logic elements at 236 MHz.

Figure 9:
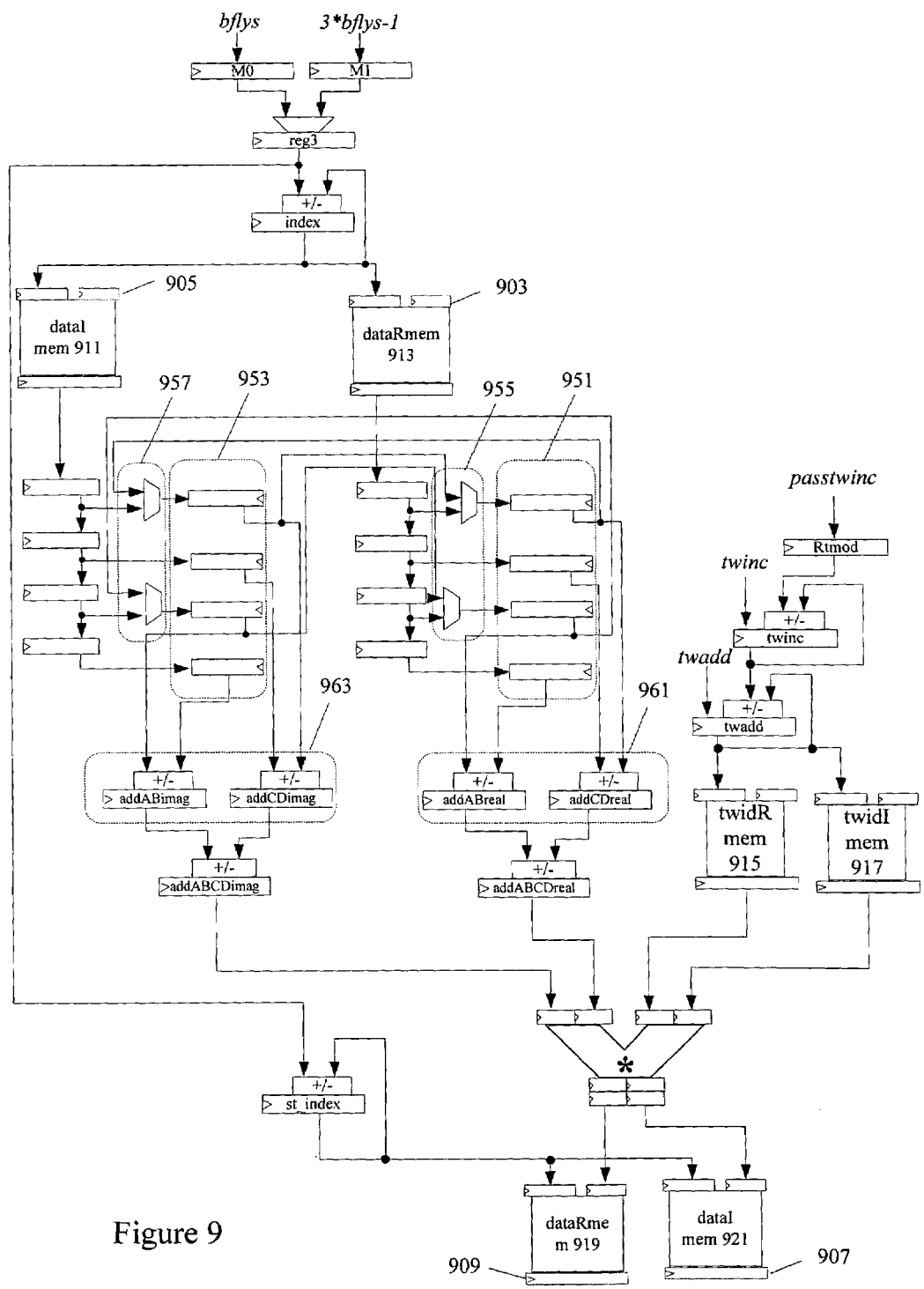
FIG. 9 is a diagrammatic representation showing one example of a radix-4 FFT data path having arguments swapped before cache.

FIG. 9 is a diagrammatic representation showing one example of a radix-4 FFT data path. The data path includes memory for real portions of complex numbers at 913, 915, and 919 and memory for imaginary portions of complex numbers at 911, 917, and 921. Ports 903, 905, 907, and 909 are available for data I/O.

According to various embodiments, real portion values adr, bdr, cdr, and ddr values are swapped in real portion cache registers 951 using real portion registered multiplexers 955 before being fed into real portion loadable adders/subtractors 961 and imaginary portion registered multiplexers 957. Imaginary portion values adi, bdi, cdi, and ddi values are swapped in imaginary portion cache registers 953 using imaginary portion registered multiplexers 957 before being fed into imaginary portion loadable adder/subtractors 963 and real portion registered multiplexers 955. According to various embodiments, only the values (bdr, bdi) and (ddr, ddi) are swapped. The calculations are shown as follows:

$$dftreala=adr+bdr+cdr+ddr;$$

$$dftimaga=adi+bdi+cdi+ddi;$$

$$dftrealb=adr+bdi-cdr-ddi;$$

$$dftimagb=adi-bdr-cdi+ddr;$$

$$dftrealc=adr-bdr+cdr-ddr;$$

$$dftimage=adi-bdi+cdi-ddi;$$

$$dftreald=adr-bdi-cdr+ddi;$$

$$dftimagd=adi+bdr-cdi-ddr;$$

Figure 10:
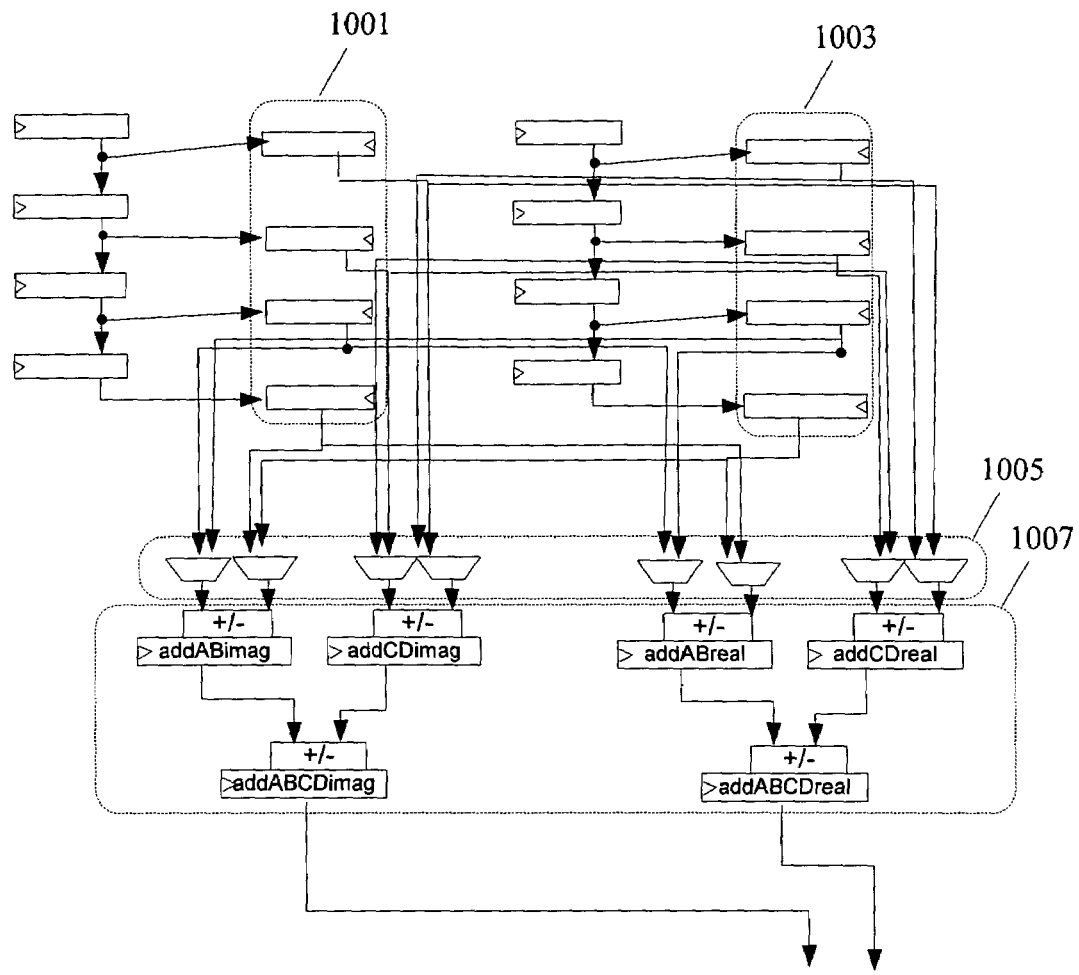
FIG. 10 is a diagrammatic representation showing one example of a radix-4 FFT data path implemented using multiplexer output selection.
Figure 11:
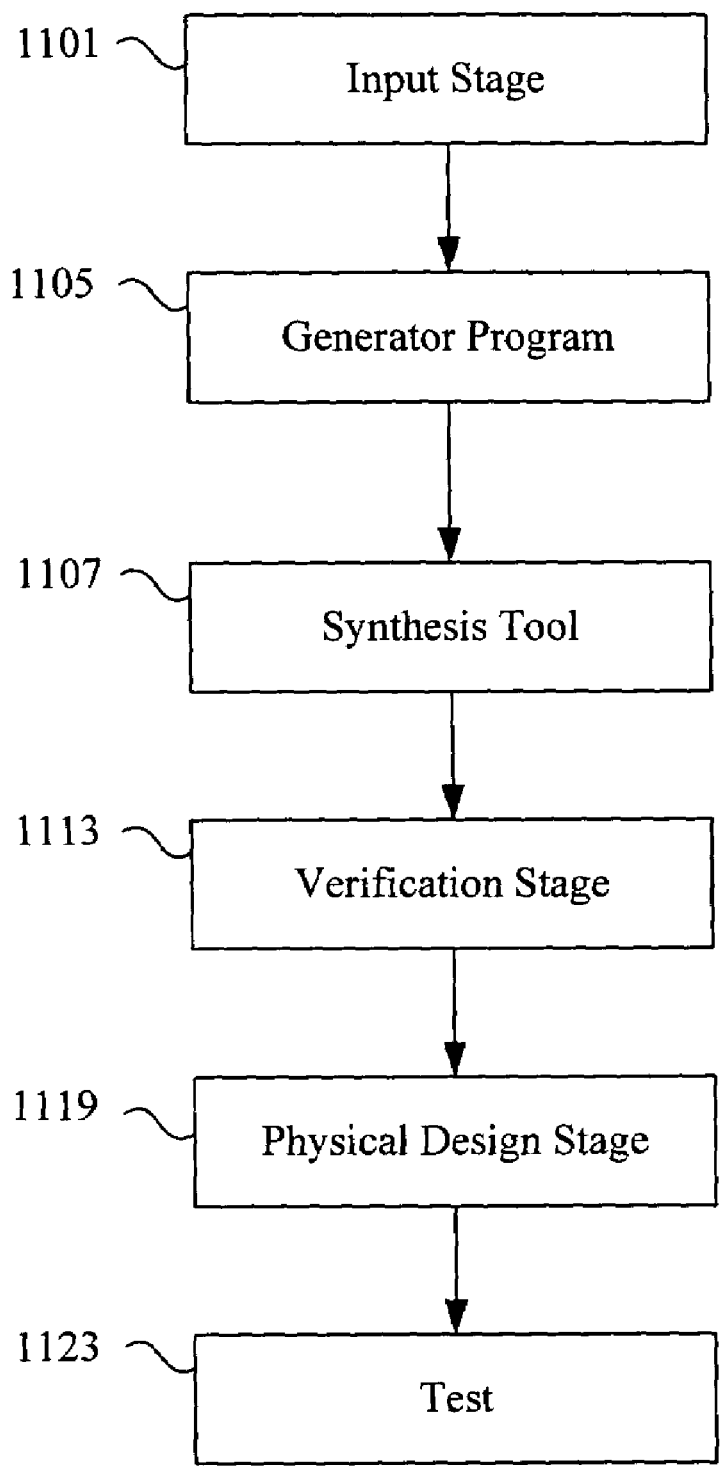
FIG. 11 is a diagrammatic representation showing a technique for implementing the programmable chip.

By contrast, typical techniques use a multiplexer to select a cache value before providing the value to adders/subtractors. A typical implementation is shown in FIG. 10. Real portion cache values 1003 and imaginary portion cache values 1001 are selected using multiplexers 1005 before being fed into adders/subtractors 1007. That is, each adder/subtractor uses a multiplexer to select a real or imaginary portion of a, b, c, or d. Although the techniques shown in FIG. 10 are logically simpler, the implementation is slower and less efficient. Values are calculated in a similar manner as above using the data path shown in FIG. 10:

$dftreala=adr+bdr+cdr+ddr;$ $dftimaga=adi+bdi+cdi+ddi;$ $dftrealb=adr+bdi-cdr-ddi;$ $dftimagb=adi-bdr-cdi+ddr;$ $dftrealc=adr-bdr+cdr-ddr;$ $dftimagc=adi-bdi+cdi-ddi;$ $dftreald=adr-bdi-cdr+ddi;$ $dftimagd=adi+bdr-cdi-ddr;$ FIG. 11 is a diagrammatic representation showing implementation of an electronic device having a customizable processor core. An input stage 1101 receives selection information for various function units and interconnections typically from a user to be implemented on an electronic device. A generator program 1105 such as an application specific processor builder creates a logic description and provides the logic description along with other customized logic to any of a variety of synthesis tools, place and route programs, and logic configuration tools to allow a logic description to be implemented on an electronic device.

In one example, an input stage 1101 often allows selection and parameterization of function units to be used on an electronic device. In some examples, function units and interconnection information are used to implement an application specific processor on a system on a programmable chip. The system on a programmable chip also includes other components provided to an input stage. Other components include intellectual property functions, megafunctions, and intellectual property cores. The input stage 1101 may be a graphical user interface using wizards for allowing efficient or convenient entry of information. The input stage may also be a text interface or a program reading a data file such as a spreadsheet, database table, or schematic to acquire selection information. The input stage 1101 produces an output containing information about the various modules selected.

In typical implementations, the generator program 1105 can identify the selections and generate a logic description with information for implementing the application specific processor. According to various embodiments, the generator program 1105 also provides information to a synthesis tool 1107 to allow HDL files to be automatically synthesized. In some examples, a logic description is provided directly by a designer. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 1101, generator program 1105, and synthesis tool 1107 can be separate programs. The interface between the separate programs can be a database file, a log, or simply messages transmitted between the programs. For example, instead of writing a file to storage, the input stage 1101 can send messages directly to the generator program 1105 to allow the generator program to create a logic description. Similarly, the generator program can provide information directly to the synthesis tool instead of writing HDL files. Similarly, input stage 1101, generator program 1105, and synthesis tool 1107 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 1107.

A synthesis tool 1107 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 1113 typically follows the synthesis stage 1107. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 1113, the synthesized netlist file can be provided to physical design tools 1119 including place and route and configuration tools. A place and route tool typically locates logic cells on specific logic elements of a target hardware device and connects wires between the inputs and outputs of the various logic elements in accordance with logic required to implement an electronic design. The device can also be physically tested at 1123. Testing can include direct probe testing and/or computer simulated testing.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 1101, the generator program 1105, the synthesis tool 1107, the verification tools 1113, and physical design tools 1119 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 12:
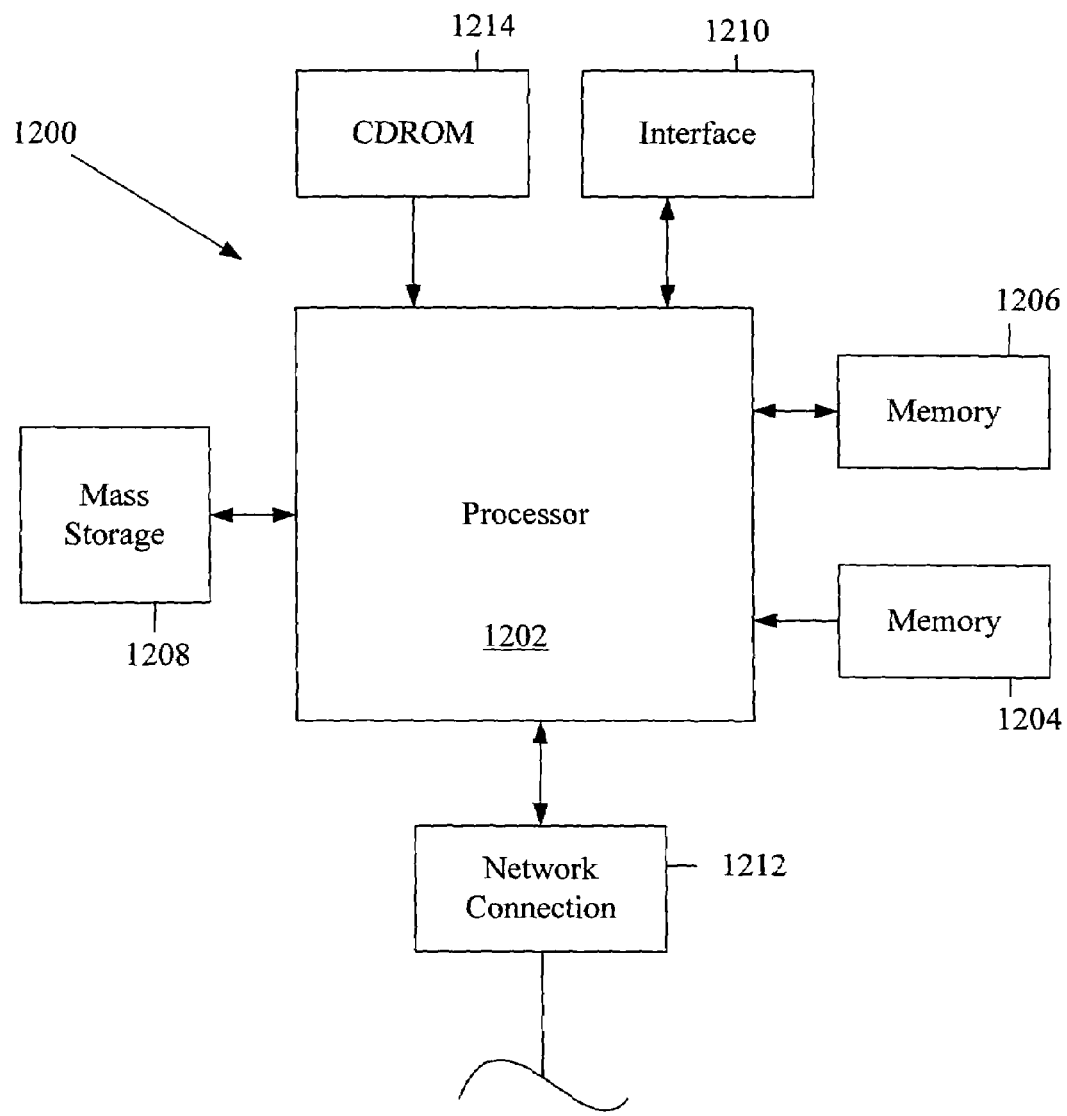
FIG. 12 is a diagrammatic representation of a computer system that can be used to implement the techniques of the present invention.

FIG. 12 illustrates a typical computer system that can be used to implement a programmable chip. The computer system 1200 includes any number of processors 1202 (also referred to as central processing units, or CPUs) that are coupled to devices including memory 1206 (typically a random access memory, or "RAM"), memory 1204 (typically a read only memory, or "ROM"). The processors 1202 can be configured to generate a test sequences for any designated processor. As is well known in the art, memory 1204 acts to transfer data and instructions uni-directionally to the CPU and memory 1206 is used typically to transfer data and instructions in a bi-directional manner.

Both of these memory devices may include any suitable type of the computer-readable media described above. A mass storage device 1208 is also coupled bi-directionally to CPU 1202 and provides additional data storage capacity and may include any of the computer-readable media described above. The mass storage device 1208 may be used to store programs, data and the like and is typically a secondary storage medium such as a hard disk that is slower than memory. The mass storage device 1208 can be used to hold a library or database of prepackaged logic or intellectual property functions, as well as information on generating particular configurations. It will be appreciated that the information retained within the mass storage device 1208, may, in appropriate cases, be incorporated in standard fashion as part of memory 1206 as virtual memory. A specific mass storage device such as a CD-ROM 1214 may also pass data uni-directionally to the CPU.

CPU 1202 is also coupled to an interface 1210 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 1202 optionally may be coupled to a computer or telecommunications network using a network connection as shown generally at 1212. With such a network connection, it is contemplated that the CPU might receive information from the network, or might output information to the network in the course of performing the above-described method steps. It should be noted that the system 1200 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 1208 or 1214 and executed on CPU 1208 in conjunction with primary memory 1206.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, the embodiments described above may be implemented using firmware, software, or hardware. Moreover, embodiments of the present invention may be employed with a variety of different file formats, languages, and communication protocols and should not be restricted to the ones mentioned above. Therefore, the scope of the invention should be determined with reference to the appended claims.

What is claimed is:

1. A method for implementing a custom processor, the method comprising:
receiving a plurality of function units corresponding to components for implementing a signal processing core as an application specific processor, the signal processing core including a Fast Fourier Transform (FFT) data path, wherein the plurality of function units for implementing the signal processing core are selected and parameterized by a user, wherein a defined function unit from a library that approximates an undefined function unit is selected when the plurality of function units includes the undefined function unit;
receiving interconnection information for connecting the plurality of function units; and
generating a hardware description for instantiating the plurality of function units and connecting the plurality of function units.

2. The method of claim 1, wherein the plurality of function units comprises a loadable shifter, a loadable adder/subtractor, and a loadable counter.

3. The method of claim 2, wherein the plurality of function units further comprises a register file and a registered 3:1 multiplexer.

4. The method of claim 1, wherein Fast Fourier Transform (FFT) arguments are swapped after FFT real portion data is read from memory but before the FFT real portion data is written to cache.

5. The method of claim 1, wherein the plurality of function units includes a plurality of defined function units.

6. The method of claim 1, wherein the signal processing core is a Fast Fourier Transform (FFT) core.

7. The method of claim 6, wherein the FFT core supports Radix-2 and Radix-4 modes.

8. The method of claim 7, wherein the signal processing core is reprogrammable as a Finite Impulse Response (FIR) core.

9. The method of claim 1, wherein the signal processing core is reprogrammable as a Fast Fourier Transform (FFT) core.

10. The method of claim 5, wherein the plurality of defined function units are defined by the user or a function unit library.

11. The method of claim 10, wherein the function unit library includes function units such as registers, memory, counters, multiply accumulate blocks, input channels, output channels, and shifters.

12. The method of claim 1, wherein an error is reported wherein the undefined function unit is detected.

13. The method of claim 12, wherein the undefined function unit is detected when a move instruction refers to the undefined function unit.

14. The method of claim 1, wherein a function unit is generated to allow a user to provide a definition when the undefined function unit is detected.

15. The method of claim 1, wherein interconnection information specifies how data is moved between the plurality of function units.

16. The method of claim 1, wherein an undefined connection is detected when a move instruction moves data between two function units that are not connected.

17. The method of claim 16, wherein an error is generated when an undefined connection is detected.

18. The method of claim 16, wherein a new path or a new route to an existing multiplexer is created when an undefined connection is detected.

19. The method of claim 1, further comprising providing a custom instruction set associated with the custom processor.

20. The method of claim 1, further comprising automatically generating a test bench for the custom processor.

21. The method of claim 1, further comprising providing the custom processor as a component on a programmable chip system.

22. A system for implementing a custom processor, the method comprising:

means for receiving a plurality of function units corresponding to components for implementing a signal processing core as an application specific processor, the signal processing core including a Fast Fourier Transform (FFT) data path, wherein the plurality of function units for implementing the signal processing core are selected and parameterized by a user, wherein a function unit is generated to allow a user to provide a definition when the plurality of function units includes an undefined function unit;

means for receiving interconnection information for connecting the plurality of function units; and means for generating a hardware description for instantiating the plurality of function units and connecting the plurality of function units.

23. A system for implementing a custom processor, the method comprising:

an interface configured to receive a plurality of function units corresponding to components for implementing a signal processing core as an application specific processor, the signal processing core including a Fast Fourier Transform (FFT) data path, wherein the plurality of function units for implementing the signal processing core are selected and parameterized by a user;

a memory configured to hold information for connecting the plurality of function units; and a processor connected to memory, the processor configured to generate a hardware description for instantiating the plurality of function units and connecting the plurality of function units, wherein a new path or a new route to an existing multiplexer is created when an undefined connection is detected.

* * * * *

UNITED STATES PATENT AND TRADEMARK OFFICE
CERTIFICATE OF CORRECTION

| | | |
|---|---|---|
| PATENT NO. | : 7,613,858 B1 | Page 1 of 1 |
| APPLICATION NO. | : 11/042887 | |
| DATED | : November 3, 2009 | |
| INVENTOR(S) | : Jackson et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 791 days.

Signed and Sealed this

Nineteenth Day of October, 2010

David J. Kappos
*Director of the United States Patent and Trademark Office*